United States Patent
Cheng et al.

(10) Patent No.: US 10,038,080 B1
(45) Date of Patent: Jul. 31, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chao-Ching Cheng, Hsinchu (TW); Jung-Piao Chiu, Kaohsiung (TW); Tsung-Lin Lee, Hsinchu (TW); Chih-Chieh Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/498,727

(22) Filed: Apr. 27, 2017

(51) Int. Cl.
| H01L 21/00 | (2006.01) |
| H01L 21/8238 | (2006.01) |
| H01L 21/336 | (2006.01) |
| H01L 27/148 | (2006.01) |
| H01L 29/76 | (2006.01) |
| H01L 29/66 | (2006.01) |
| H01L 29/78 | (2006.01) |
| H01L 29/06 | (2006.01) |
| H01L 23/535 | (2006.01) |
| H01L 21/768 | (2006.01) |
| H01L 21/306 | (2006.01) |

(52) U.S. Cl.
CPC .. *H01L 29/66795* (2013.01); *H01L 21/30604* (2013.01); *H01L 21/76895* (2013.01); *H01L 23/535* (2013.01); *H01L 29/0649* (2013.01); *H01L 29/66545* (2013.01); *H01L 29/66553* (2013.01); *H01L 29/785* (2013.01)

(58) Field of Classification Search
CPC ..... H01L 21/823431; H01L 21/823487; H01L 21/823821; H01L 21/823885; H01L 27/0886; H01L 27/0924; H01L 27/10841; H01L 29/785; H01L 29/78642; H01L 29/7926; H01L 29/66795; H01L 29/66545
USPC ........ 438/156, 173, 192, 212, 268; 257/220, 257/263, 328, 330, 331
See application file for complete search history.

(56) References Cited

U.S. PATENT DOCUMENTS

| 2014/0138780 A1* | 5/2014 | Colinge | ............ H01L 29/66545 257/402 |
| 2017/0194213 A1* | 7/2017 | Ching | ............... H01L 21/82382 |

* cited by examiner

*Primary Examiner* — Hsien Ming Lee
(74) *Attorney, Agent, or Firm* — McClure, Qualey & Rodack, LLP

(57) ABSTRACT

A method for manufacturing a semiconductor device includes forming a first dummy gate over a substrate; forming at least one epitaxy structure in contact with the first dummy gate; forming a spacer layer in contact with the first dummy gate and the epitaxy structure; and replacing the first dummy gate with a metal gate stack.

20 Claims, 24 Drawing Sheets

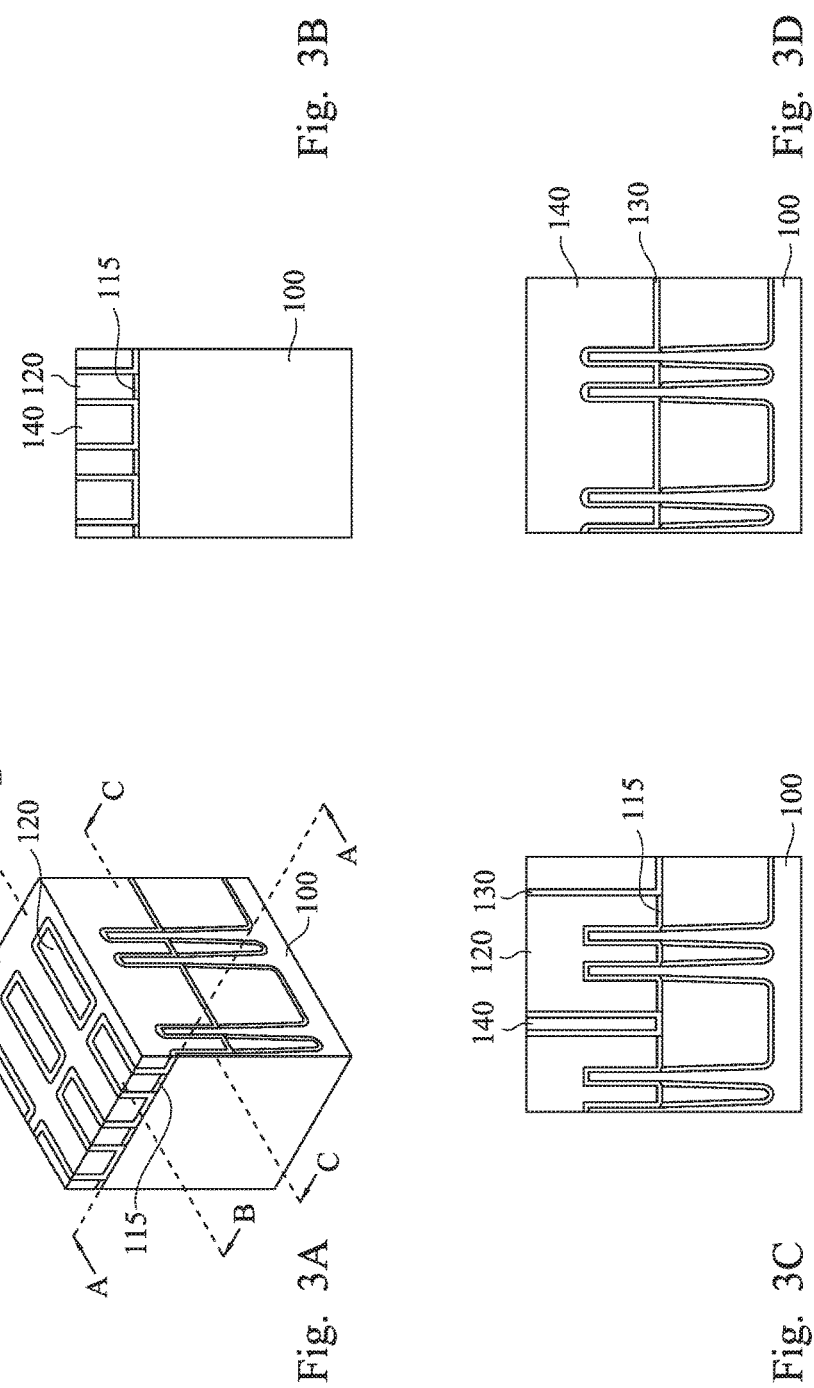

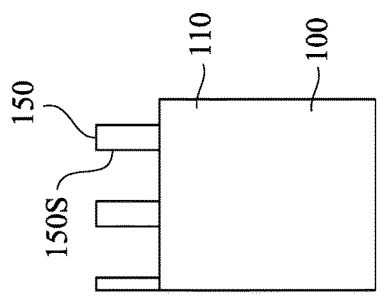
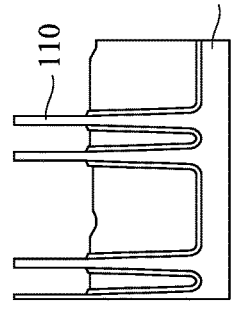
Fig. 6B
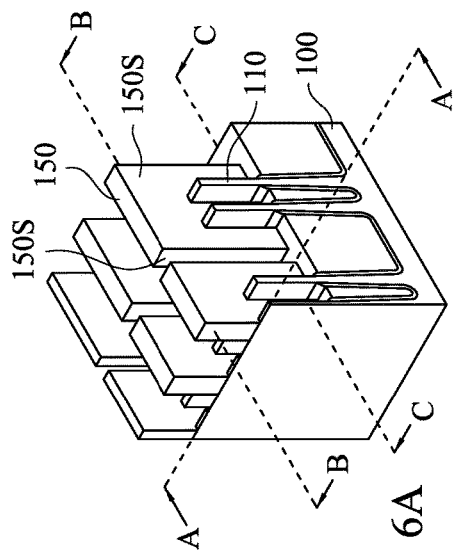
Fig. 6A
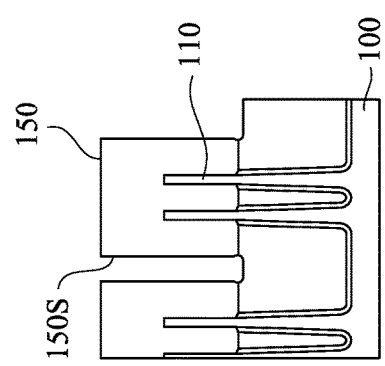
Fig. 6C
Fig. 6D

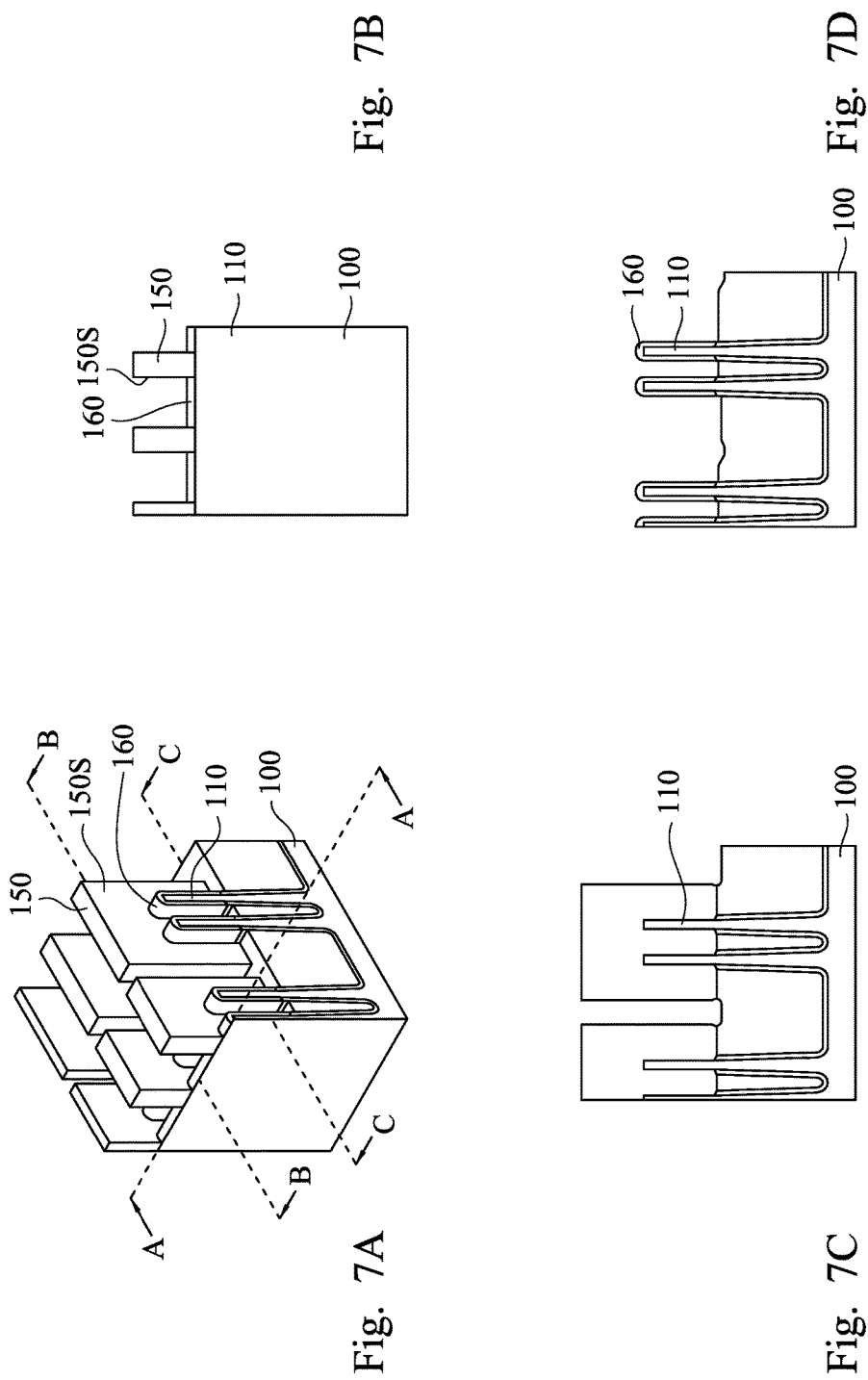

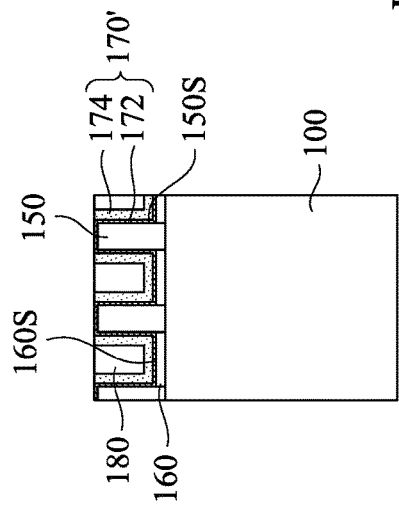
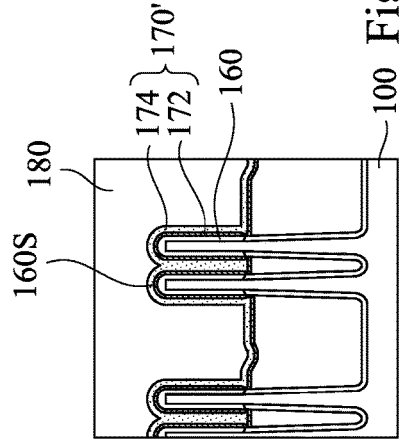
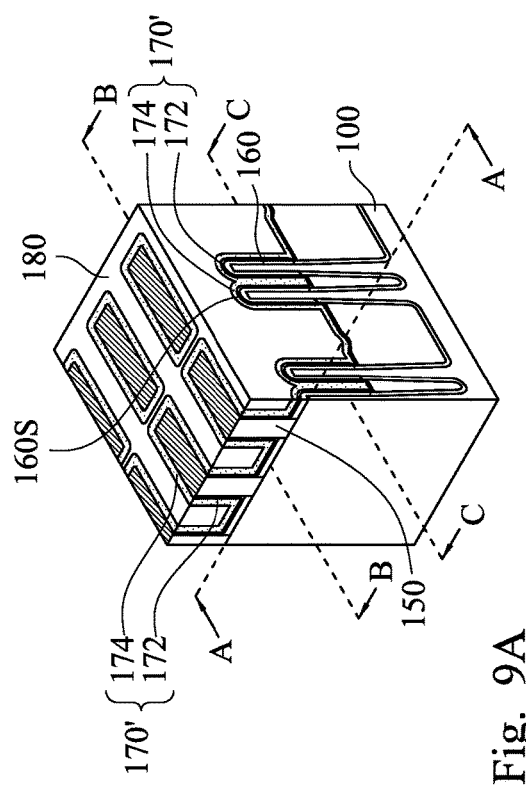
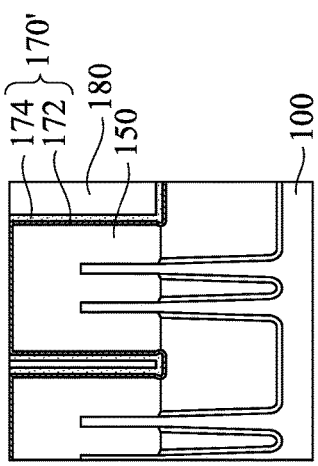
Fig. 9A
Fig. 9B
Fig. 9C
Fig. 9D

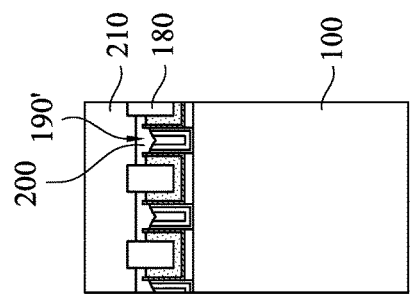
Fig. 16A
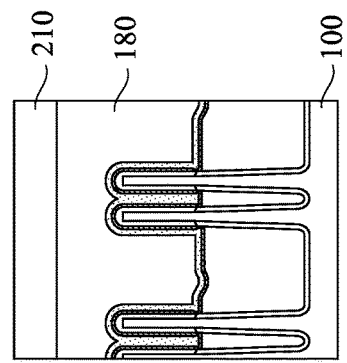
Fig. 16B
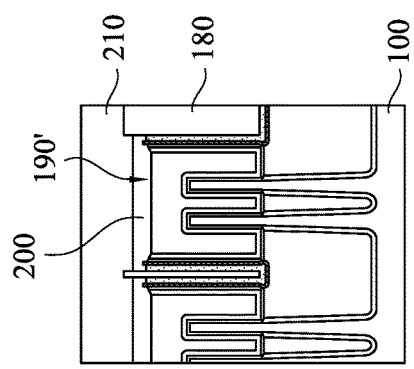
Fig. 16C
Fig. 16D

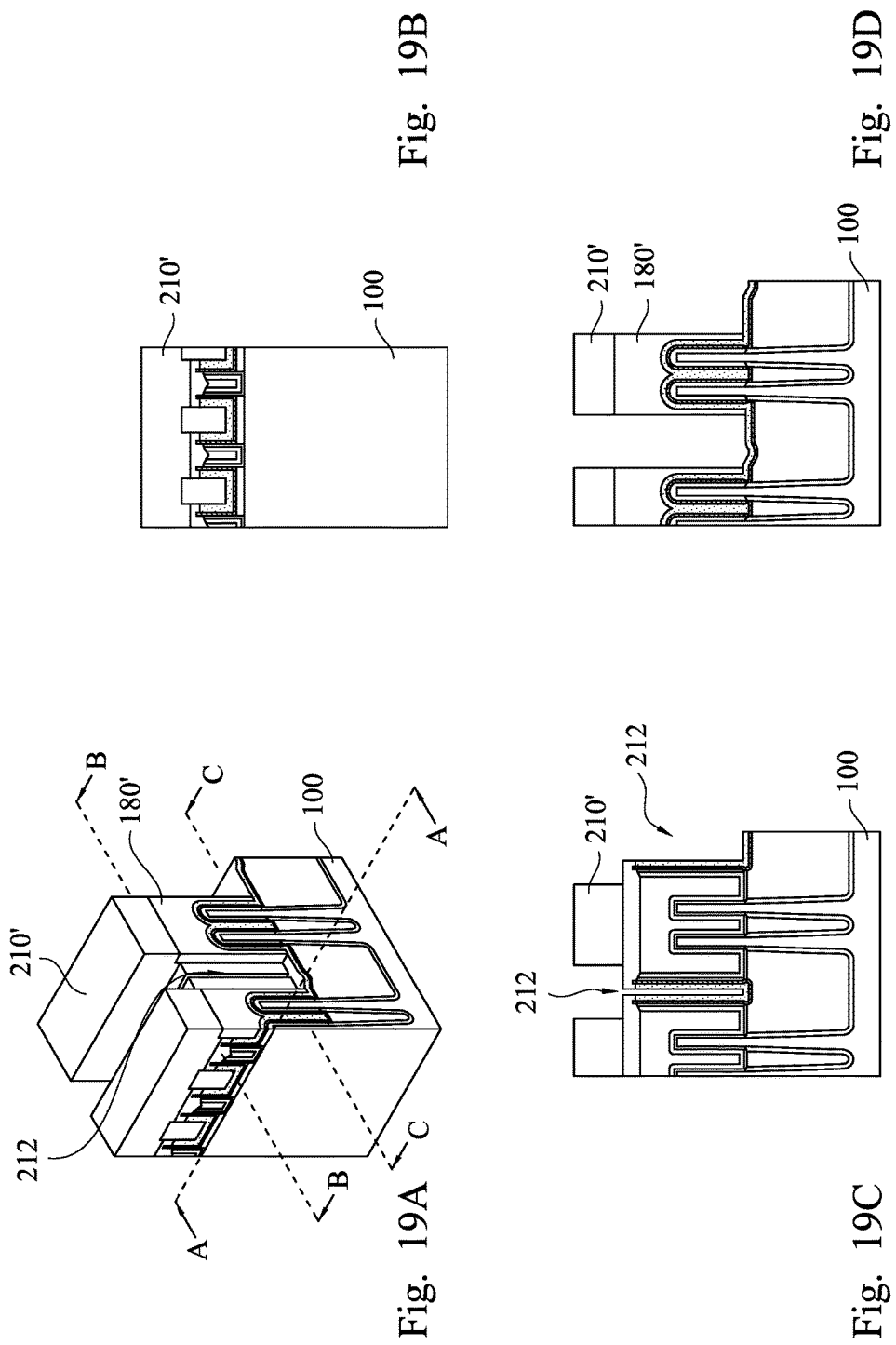

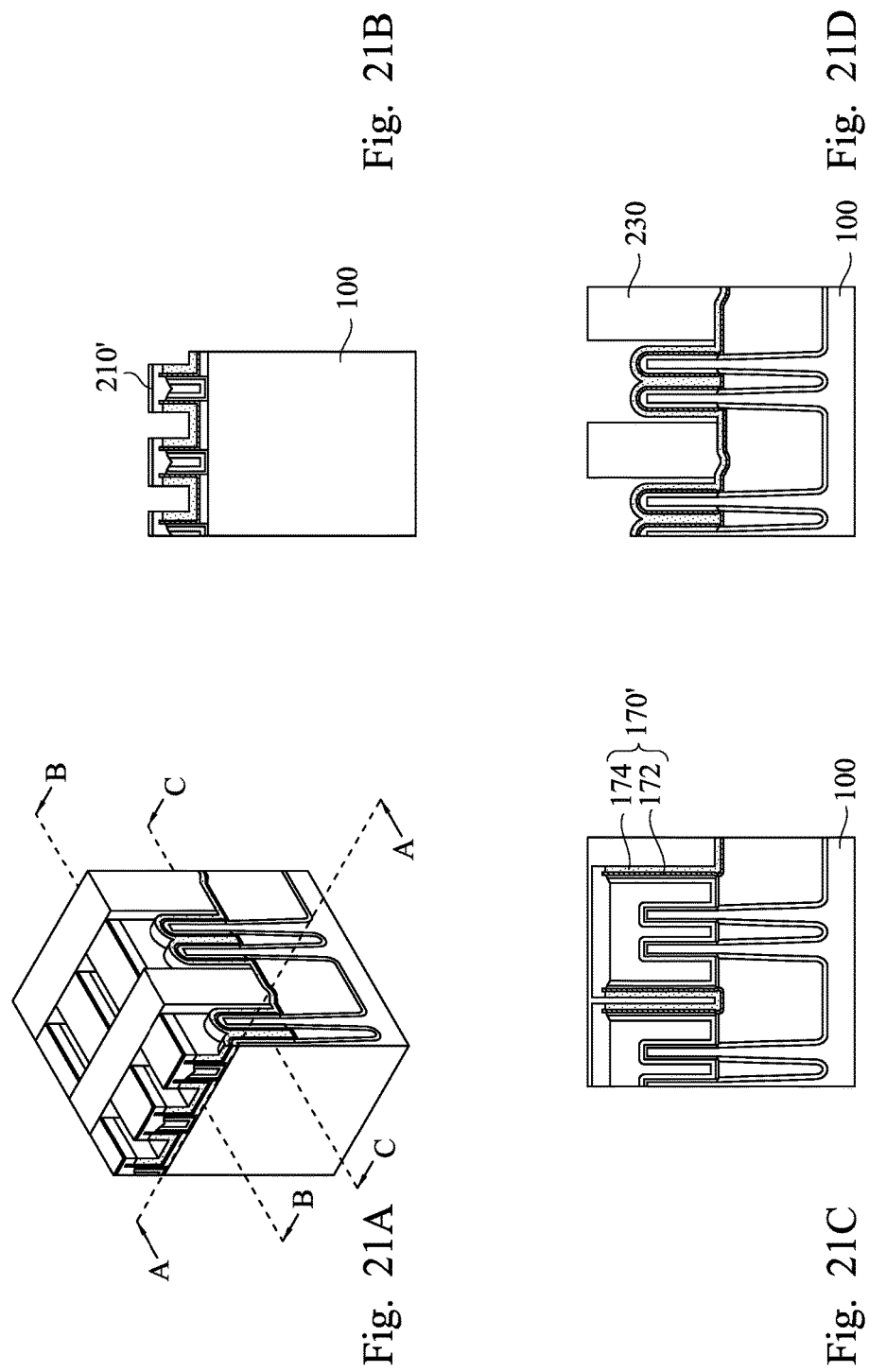

SEMICONDUCTOR DEVICE AND MANUFACTURING METHOD THEREOF

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). FinFET devices are a type of multi-gate structure that include semiconductor fins and in which channel and source/drain regions of semiconductor transistor devices are formed. A gate is formed over and along the sides of the fin structure (e.g., wrapping) utilizing the increased surface area of the channel and source/drain regions to produce fast, reliable and well-controlled semiconductor transistor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 24A are local perspective views of a method for manufacturing a semiconductor device at various stages in accordance with some embodiments of the present disclosure.

FIGS. 1B to 24B are cross-sectional views of line A-A of FIGS. 1A to 24A.

FIGS. 1C to 24C are cross-sectional views of line B-B of FIGS. 1A to 24A.

FIGS. 1D to 24D are cross-sectional views of line C-C of FIGS. 1A to 24A.

DETAILED DESCRIPTION

Figure 1B:
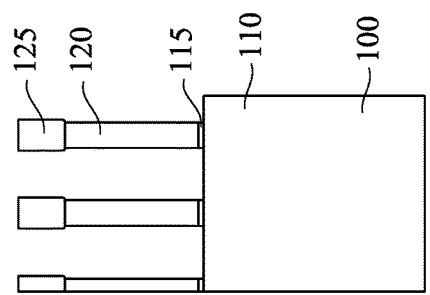
Figure 1D:
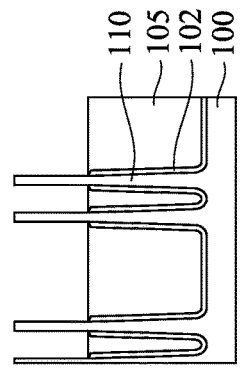
Figure 1A:
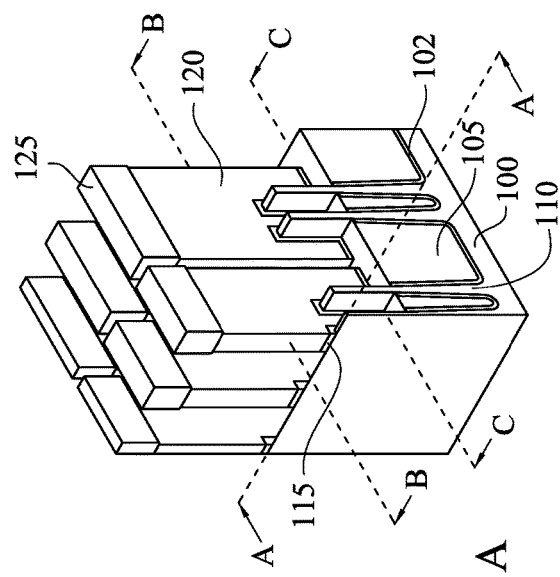
Figure 1C:
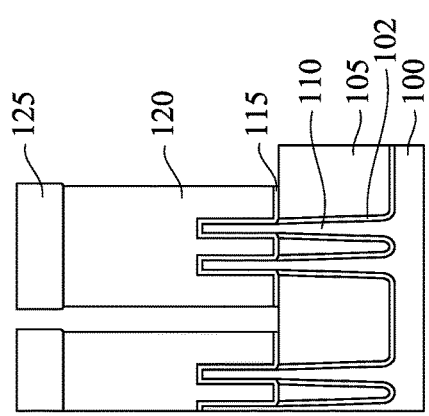
Figure 2A:
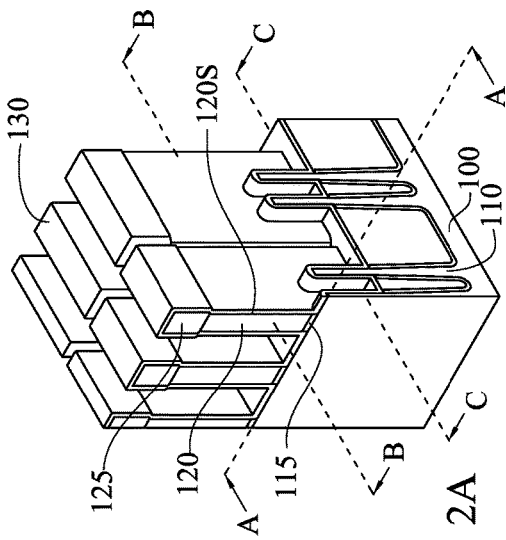
Figure 2B:
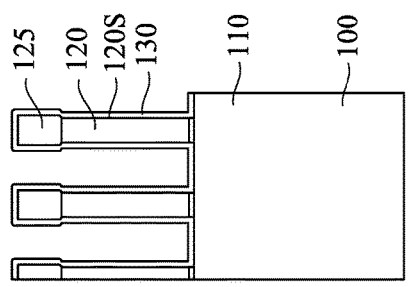
Figure 2C:
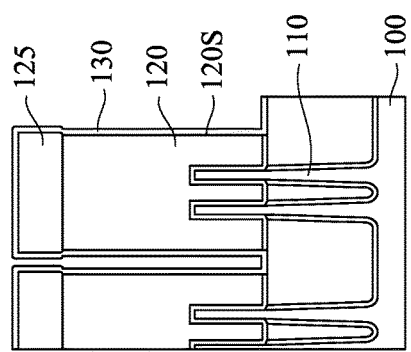
Figure 2D:
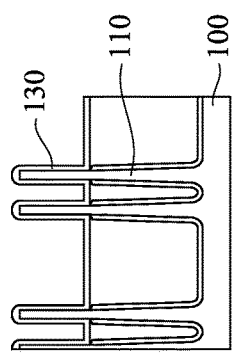
Figure 4A:
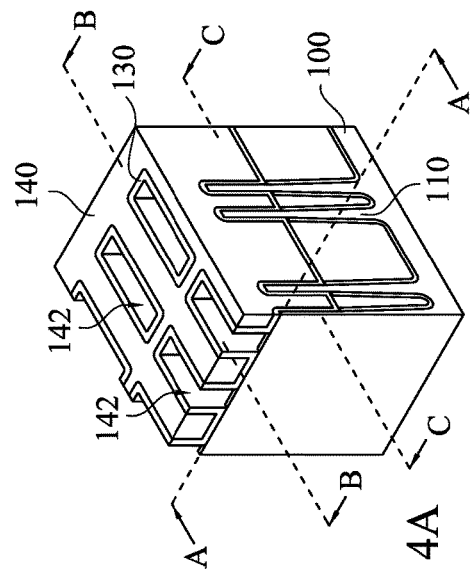
Figure 4B:
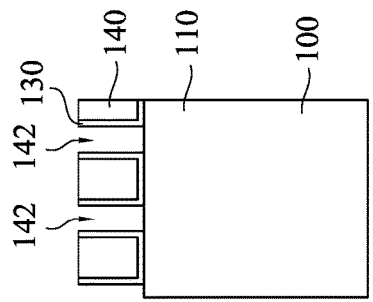
Figure 4C:
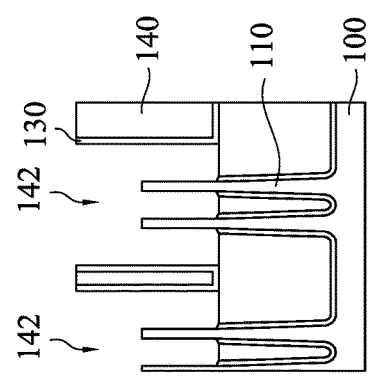
Figure 4D:
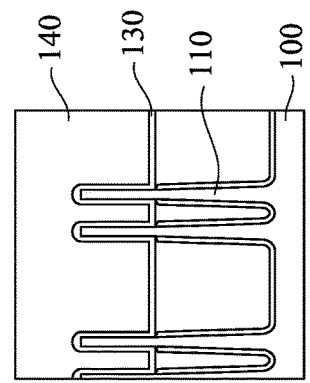
Figure 5B:
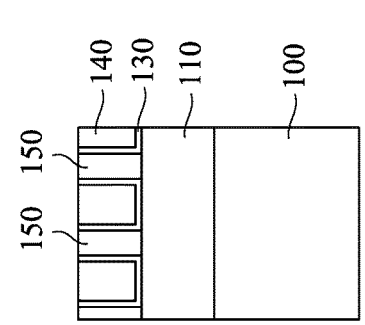
Figure 5D:
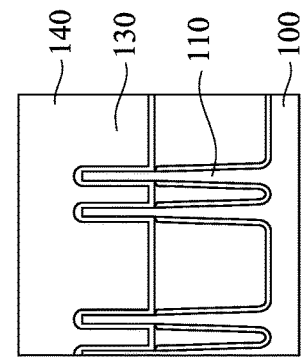
Figure 5A:
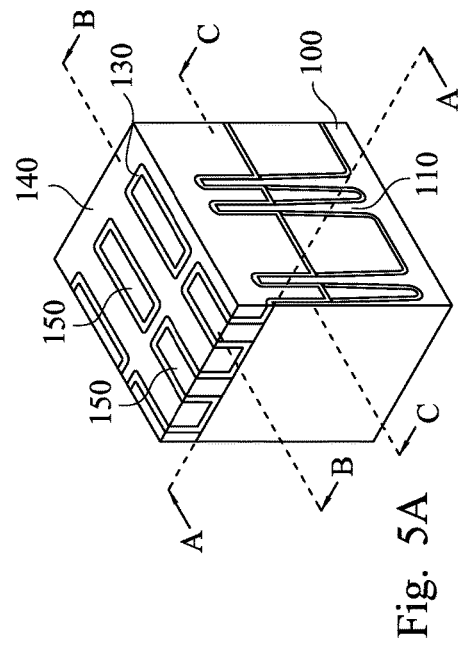
Figure 5C:
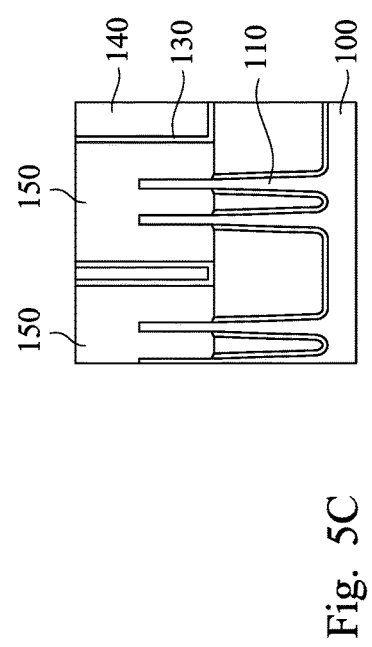
Figure 8B:
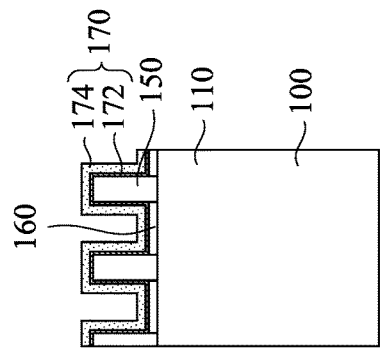
Figure 8D:
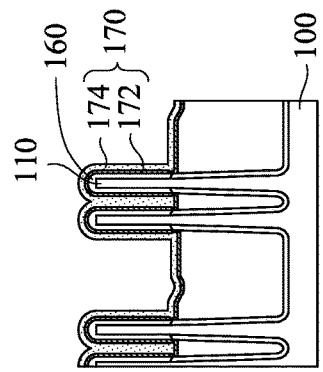
Figure 8A:
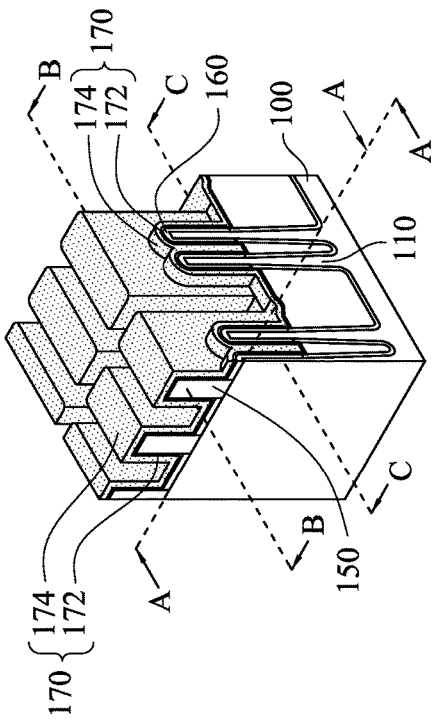
Figure 8C:
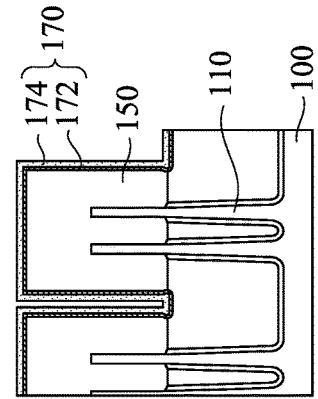
Figure 10B:
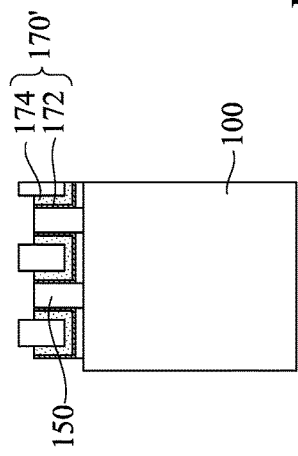
Figure 10A:
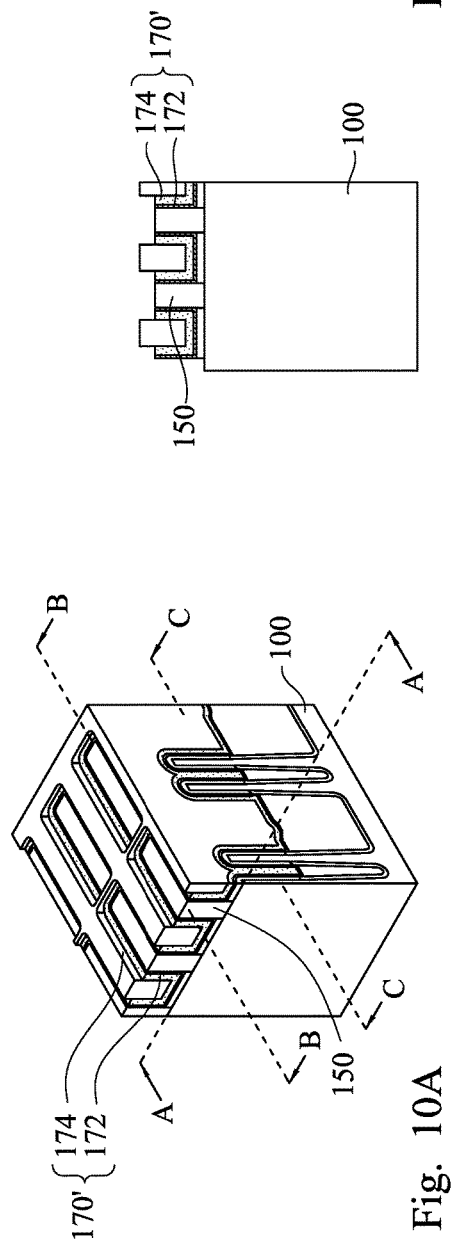
Figure 10D:
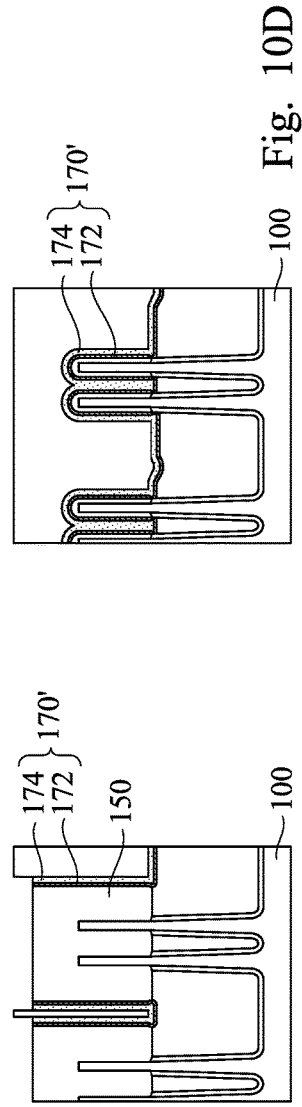
Figure 10C:
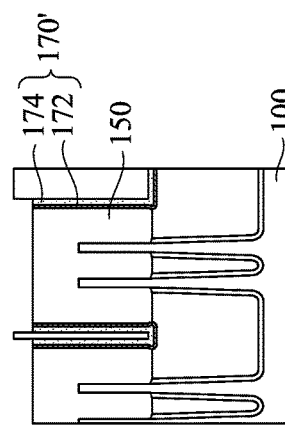
Figure 11A:
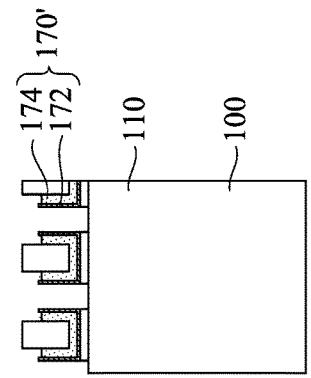
Figure 11B:
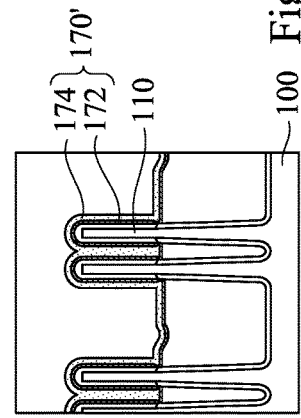
Figure 11C:
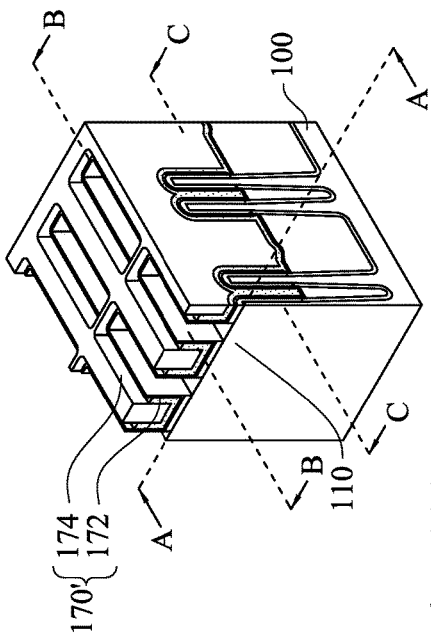
Figure 11D:
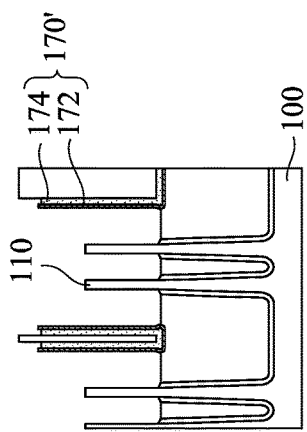

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of structures that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device.

FIGS. 1A to 24A are local perspective views of a method for manufacturing a semiconductor device at various stages in accordance with some embodiments of the present disclosure. FIGS. 1B to 24B are cross-sectional views of line A-A of FIGS. 1A to 24A. FIGS. 1C to 24C are cross-sectional views of line B-B of FIGS. 1A to 24A. FIGS. 1D to 24D are cross-sectional views of line C-C of FIGS. 1A to 24A.

Reference is made to FIGS. 1A, 1B, 1C, and 1D. A substrate 100 is provided. The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

A plurality of semiconductor fins 110 are formed on the substrate 100. In some embodiments, the semiconductor fins 110 include silicon. The semiconductor fins 110 may be patterned by any suitable method. For example, the semiconductor fins 110 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A plurality of isolation structures 105 are formed on the substrate 100 and adjacent to the semiconductor fins 110. The isolation structures 105, which act as a shallow trench isolation (STI) around the semiconductor fins 110 may be formed by chemical vapor deposition (CVD) techniques using tetra-ethyl-ortho-silicate (TEOS) and oxygen as a precursor. In yet some other embodiments, the isolation structures 105 are insulator layers of a SOI wafer. In some embodiments, a lining layer 102 is formed on the substrate 100, and the isolation structures 105 are formed on the lining layer 102.

A plurality of first dummy gates 120 and gate dielectric 115 are formed over and crossing the semiconductor fins 110 of the substrate 100. The first dummy gates 120 may include polycrystalline-silicon (poly-Si) or poly-crystalline silicon-germanium (poly-SiGe). Further, the first dummy gates 120 may be doped poly-silicon with uniform or non-uniform doping. The gate dielectric 115 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

A plurality of hard masks 125 are formed respectively on the first dummy gates 120. The hard masks 125 may include silicon nitride (SiN), silicon oxynitride (SiON), silicon carbide (SiC), SiOC, spin-on glass (SOG), a low-κ film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof.

In some embodiments, the gate dielectric 115 and the first dummy gates 120 are formed by, for example, depositing a gate dielectric layer and a dummy material layer over the substrate 100. Then, the hard masks 125 are formed over the substrate 100, in which the hard masks 125 defines a profile of the first dummy gates 120. The gate dielectric layer and the dummy material layer are then patterned with the hard masks 125 to form the gate dielectric 115 and the first dummy gates 120.

Reference is made to FIGS. 2A, 2B, 2C, and 2D. A plurality of selective etching stop layers 130 are formed over the substrate 100 and the first dummy gates 120. The selective etching stop layers 130 cover the hard masks 125, the first dummy gates 120, and the semiconductor fins 110. Further, the selective etching stop layers 130 are formed on opposite sidewalls 120S of the first dummy gates 120. The selective etching stop layers 130 may be formed by suitable process, such as CVD. In some embodiments, the selective etching stop layers 130 are made from Al2O3 or suitable materials. In some embodiments, the materials of the selective etching stop layers 130 may have etching selectivity to oxide, SiN, Si, and SiGe.

Reference is made to FIGS. 3A, 3B, 3C, and 3D. A first interlayer dielectric 140 is formed on the selective etching stop layers 130 and over the substrate 100. Then, a chemical mechanism planarization (CMP) process is performed to remove excessive first interlayer dielectric 140 and the hard masks 125 (see FIGS. 2A to 2D), such that the first dummy gates 120 are exposed. The first interlayer dielectric 140 can be formed by a suitable technique, such as CVD or ALD. In some embodiments, the first interlayer dielectric 140 may include silicon oxide, oxynitride or other suitable materials, and may include a single layer or multiple layers.

Reference is made to FIGS. 4A, 4B, 4C, and 4D. The first dummy gates 120 and the gate dielectrics 115 (see FIGS. 3A to 3C) are removed to form a plurality of openings 142 in the first interlayer dielectric 140 and between the selective etching stop layers 130. Portions of the semiconductor fins 110 of the substrate 100 are exposed through the openings 142. The first dummy gates 120 and the gate dielectrics 115 may be removed by suitable process(es), such as etching process.

In some embodiments, the etching process may include dry etching process, wet etching process, and/or combinations thereof. The etching process may also include a selective wet etch or a selective dry etch. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH$_4$OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Reference is made to FIGS. 5A, 5B, 5C, and 5D. A plurality of second dummy gates 150 are formed in the openings 142 (see FIGS. 4A to 4C) and over the semiconductor fin 110 of the substrate 100. That is, the first dummy gates 120 (see FIGS. 3A to 3C) are replaced by the second dummy gates 150. In some embodiments, the second dummy gates 150 may include silicon nitride (SiN), silicon oxy-nitride (SiON), or other suitable material. The second dummy gates 150 may be formed by, for example, depositing a dummy material layer over the substrate 100. A CMP process is then performed to the dummy material layer until the first interlayer dielectric 140 is exposed, such that the second dummy gates 150 are formed.

Reference is made to FIGS. 6A, 6B, 6C, and 6D. The first interlayer dielectric 140 (see FIGS. 5A to 5D) and the selective etching stop layers 130 (see FIGS. 5A to 5D) are removed. After the removal, portions of the semiconductor fins 110 of the substrate 100 and sidewalls 150S of the second dummy gates 150 are exposed. In some embodiments, the first interlayer dielectric 140 and the selective etching stop layers 130 may be removed by one or more suitable process(es), such as etching process(es).

Reference is made to FIGS. 7A, 7B, 7C, and 7D. A plurality of epitaxy structures 160 are formed respectively on the semiconductor fins 110 of the substrate 100. The epitaxy structures 160 are in contact with the sidewall 150S of the second dummy gates 150, as shown in FIGS. 7A and 7B.

In some embodiments, the epitaxy structures 160 may be cladding epitaxy structures. The epitaxy structures 160 can be an n-type epitaxy structure or a p-type epitaxy structure. The epitaxy structures 160 may be formed using one or more epitaxy or epitaxial (epi) processes, such that Si features, SiGe features, and/or other suitable features can be formed in a crystalline state on the fin structure 110. In some embodiments, lattice constants of the epitaxy structures 160 is different from lattice constants of the fin structure 110, and the epitaxy structures 160 is strained or stressed to enable carrier mobility of the semiconductor device and enhance the device performance. The epitaxy structures 160 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, the epitaxy structures 160 may include SiP, SiC, SiPC, Si, III-V compound semiconductor materials, or combinations thereof for the n-type epitaxy structure, and the epitaxy structures 160 may include SiGe, SiGeC, Ge, Si, III-V compound semiconductor materials, or combinations thereof for the p-type epitaxy structure. During the formation of the n-type epitaxy structure, n-type impurities such as phosphorous or arsenic may be doped with the proceeding of the epitaxy. For example, when the epitaxy structures 160 include SiC or Si, n-type impurities are doped. Moreover, during the formation of the p-type epitaxy structure, p-type impurities such as boron or BF$_2$ may be doped with the proceeding of the epitaxy. For example, when the epitaxy structures 160 includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 110 (e.g., silicon). Thus, a strained channel can be achieved to increase carrier mobility and enhance device performance. The epitaxy structures 160 may be in-situ doped. If the epitaxy structures 160 are not in-situ doped, a second implantation process (i.e., a junction implant process) is performed to dope the epitaxy structures 160. One or more annealing processes may be performed to activate the epitaxy structures 160. The annealing processes include rapid thermal annealing (RTA) and/or laser annealing processes.

Reference is made to FIGS. 8A, 8B, 8C, and 8D. A spacer layer 170 is formed over the substrate 100. The spacer 170 is in contact with the second dummy gates 150 and the epitaxy structures 160. The spacer layer 170 includes a first dielectric layer 172 and a second dielectric layer 174 disposed over the first dielectric layer 172. The first dielectric layer 172 and a second dielectric layer 174 may be formed by suitable process(es), such as CVD, PVD, ALD, or other suitable technique. In some embodiments, the first dielectric layer 172 may be made from oxide, DHF-etched HK dielectrics, e.g., $Al_2O_3$, and metal-silicate dielectrics, e.g. AlSiO, HfSiO. The second dielectric layer 174 may be made from silicon carbon nitride (SiCN), nitride-based dielectrics, e.g., SiN, SiCON. In some other embodiments, the second dielectric layer 174 may be made from low-k material.

Reference is made to FIGS. 9A, 9B, 9C, and 9D. A second interlayer dielectric 180 is formed over the substrate 100 and between the gate spacers 170 (see FIG. 9A to 9D). A CMP process is then performed to remove the excessive second interlayer dielectric 180 until the spacer layer 170 is exposed. The second interlayer dielectric 180 can be formed by a suitable technique, such as CVD or ALD. In some embodiments, the second interlayer dielectric 180 may include silicon, other suitable materials, and may include a single layer or multiple layers. For example, the second interlayer dielectric 180 maybe made from a-Si.

After the CMP process is performed, a plurality of gate spacers 170' are formed accordingly. Similarly, the gate spacers 170' include a first dielectric 172 and a second dielectric 174, as described in FIGS. 8A to 8D. In, FIG. 9B, the gate spacers 170' are disposed on and in contact with the sidewalls 150S of the second dummy gate 150 and the top surfaces 160S of the epitaxy structures 160.

Reference is made to FIGS. 10A, 10B, 10C, and 10D. A first etching back process is performed to partially remove the gate spacers 170' and the second dummy gates 150. The first etching back process may include one or more etching(s), such as dry etching or wet etching. After the first etching back process is performed, the top surfaces of the second dummy gates 150 are exposed from the gate spacers 170'.

Reference is made to FIGS. 11A, 11B, 11C, and 11D. The second dummy gates 150 (see FIGS. 10A to 10C) are removed. Portions of the semiconductor fins 110 of the substrate 100 in FIGS. 10A to 10C covered by the second dummy gates 150 are exposed after the second dummy gates 150 are removed. The second dummy gates 150 may be removed by suitable process(es), such as etching. In some embodiments, during the removal of the second dummy gates 150, portions of the second dielectrics 174 of the gate spacers 170' are also removed.

Figure 12B:
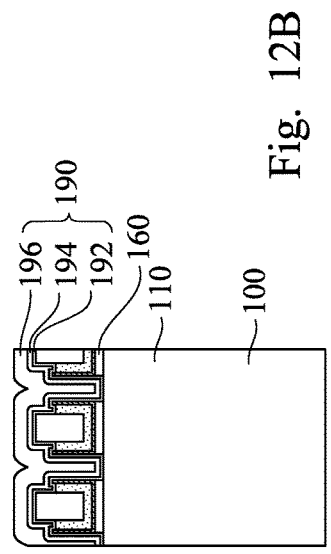
Figure 12A:
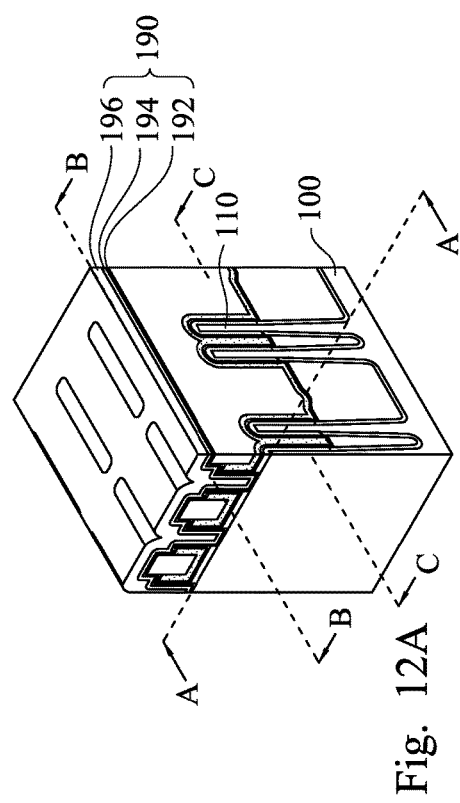
Figure 12C:
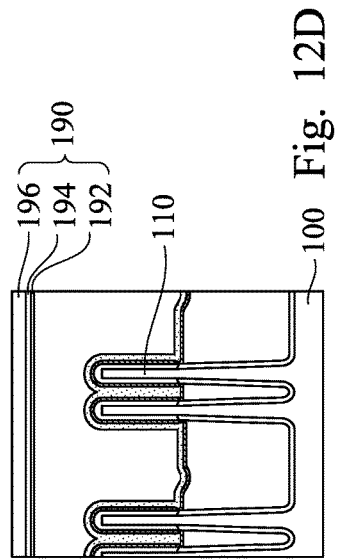
Figure 12D:
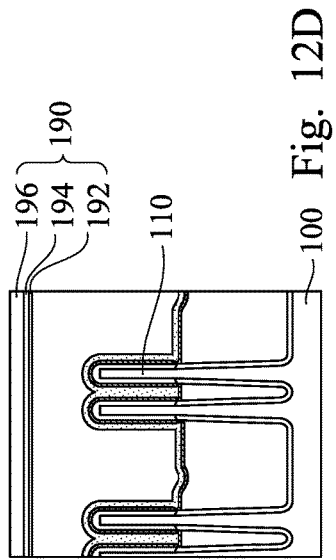
Figure 13A:
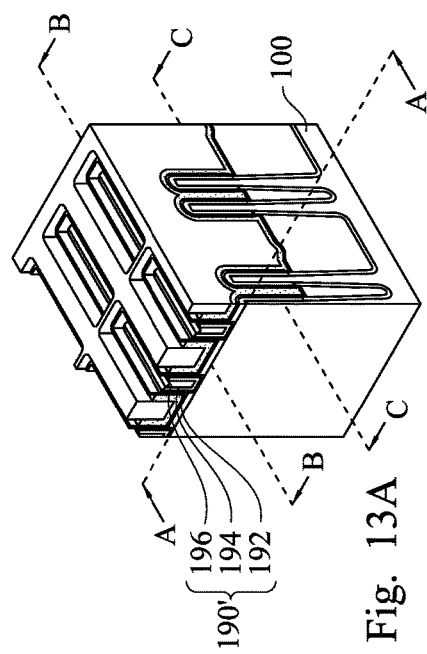
Figure 13B:
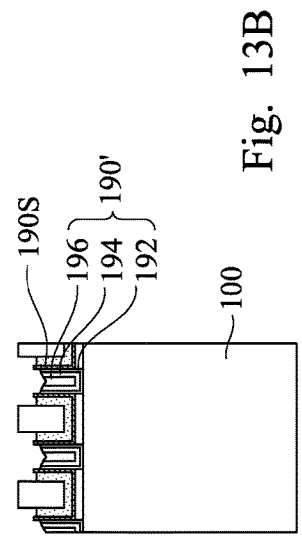
Figure 13C:
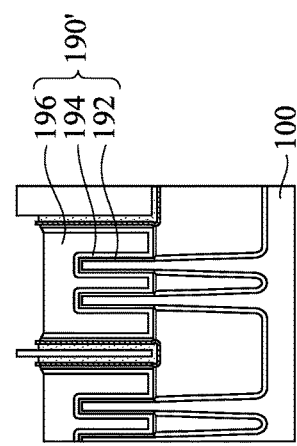
Figure 13D:
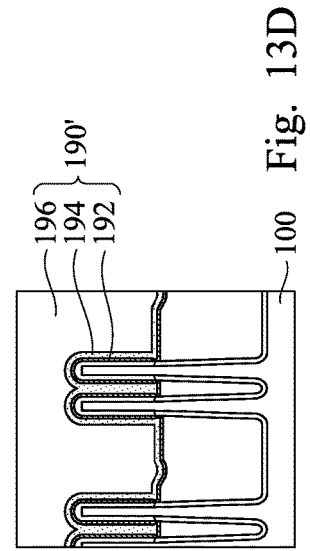
Figure 14B:
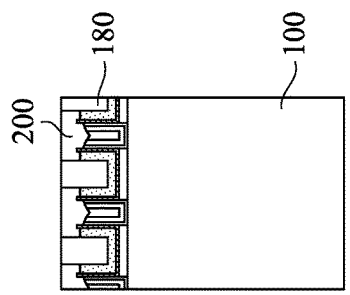
Figure 14D:
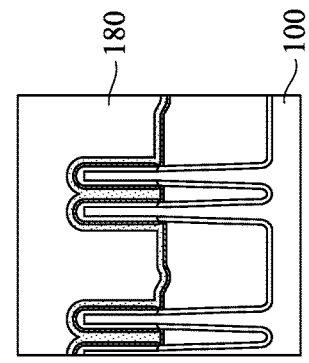
Figure 14A:
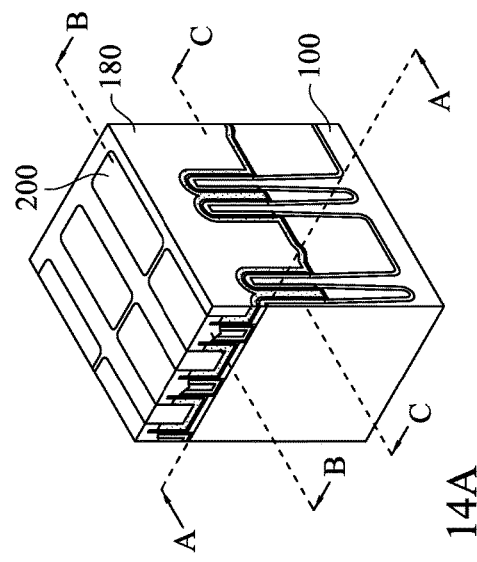
Figure 14C:
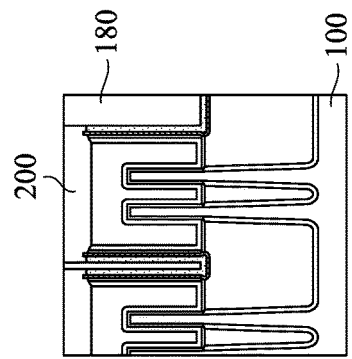
Figure 15B:
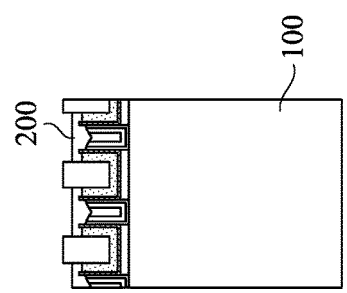
Figure 15D:
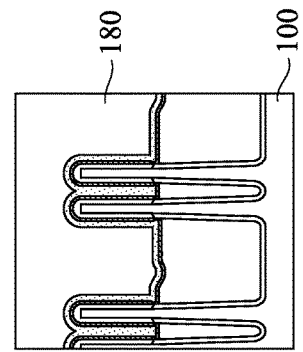
Figure 15A:
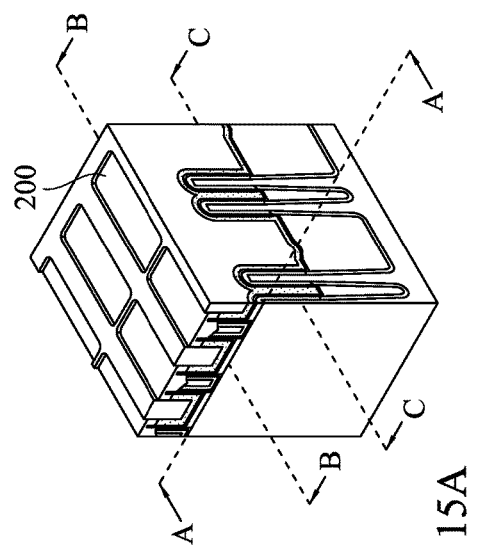
Figure 15C:
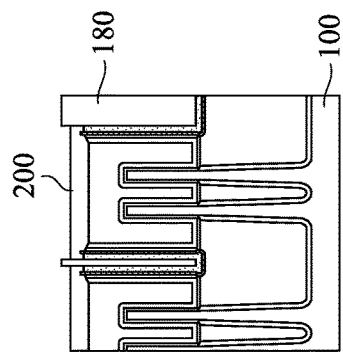
Figure 17B:
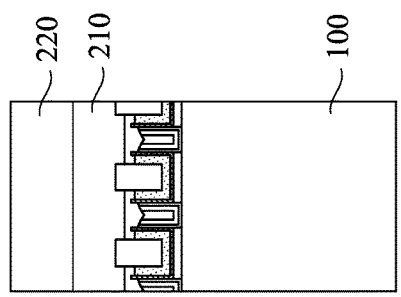
Figure 17D:
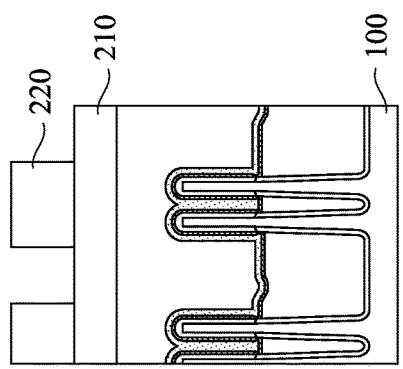
Figure 17A:
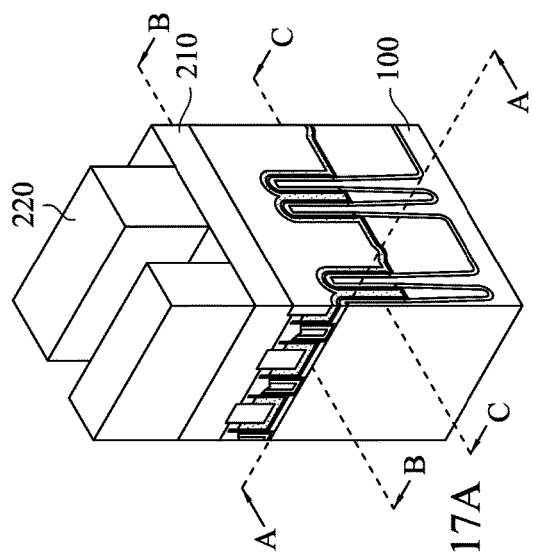
Figure 17C:
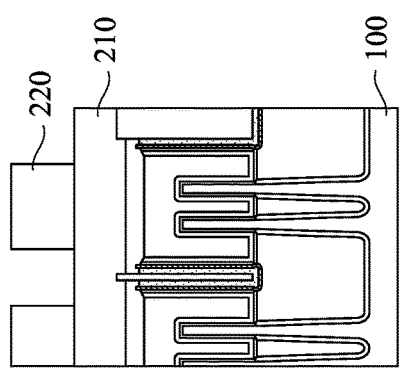
Figure 18B:
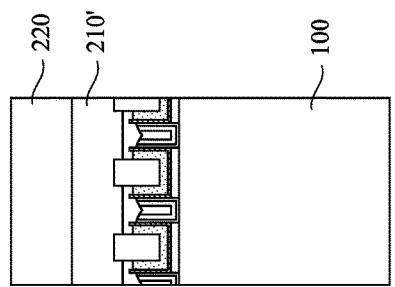
Figure 18D:
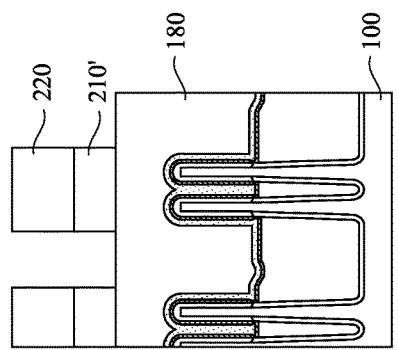
Figure 18A:
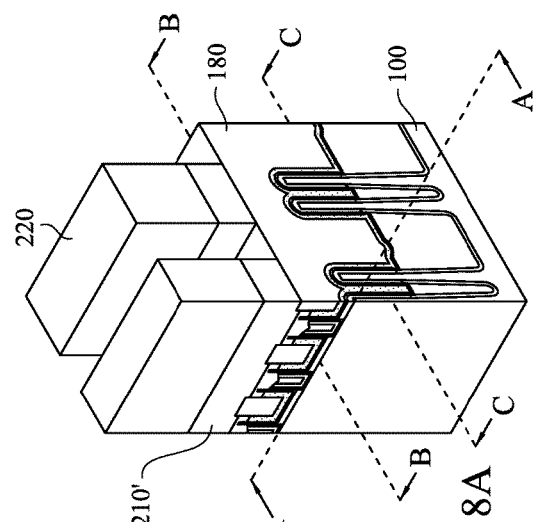
Figure 18C:
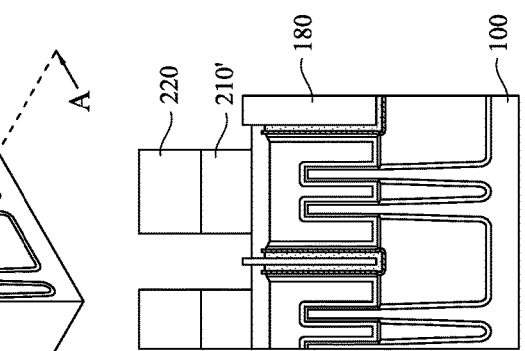

Reference is made to FIGS. 12A, 12B, 12C, and 12D. A plurality of metal gate stacks 190 are formed over the semiconductor fins 110 of the substrate 100. That is, the second dummy gates 150 (see FIGS. 10A to 10C) are replaced by the metal gate stacks 190. In some embodiments, the metal gate stacks 190 include a high-k dielectric layer 192, a work function layer 194, and a metal gate electrode layer 196. In FIG. 12B, since the epitaxy structures 160 are formed before the gate spacers 170', the epitaxy structures 160 are in contact with the high-k dielectric layer 192 of the gate stacks 190.

In some embodiments, the high-k dielectric layer 192 is made of metal oxides, metal nitrides, metal silicates, transition metal-oxides, transition metal-nitrides, transition metal-silicates, or oxynitrides of metals. Examples of the high-k dielectric material include, but are not limited to, hafnium oxide (HfO2), hafnium silicon oxide (HfSiO), hafnium silicon oxynitride (HfSiON), hafnium tantalum oxide (HMO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

In some embodiments, the work function layer 194 is formed over high-k dielectric layer 192. The work function metal layer may be tuned to have a proper work function. For example, if a P-type work function metal (P-metal) for a P-type device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for N-type devices is desired, N-type metal materials may be used. Examples of N-type work function materials include, but are not limited to, titanium aluminide (TiAl), titanium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

In some embodiments, the metal gate electrode layer 196 is formed over work function layer 194. In some embodiments, metal gate electrode layer 196 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials.

Reference is made to FIGS. 13A, 13B, 13C, and 13D. A second etching back process is performed to the metal gate stacks 190 (see FIGS. 12A to 12D) to recess the high-k dielectric layer 192, the work function layer 194, and the metal gate electrode layer 196 of the gate stacks layer 190. As a result, a plurality of recessed metal gate stacks 190' are formed. Similarly, the recessed metal gate stacks 190' include the high-k dielectric layer 192, the work function layer 194, and the metal gate electrode layer 196, as described in FIGS. 12A to 12D.

Reference is made to FIGS. 14A, 14B, 14C, and 14D. A plurality of hard masks 200 are formed respectively on the recessed metal gate stacks 190'. In some embodiments, the hard masks 200 may be formed by depositing a mask layer over the substrate 100 and following with a CMP process until the second interlayer dielectric 180 is exposed. In some embodiments, the hard masks 200 may include silicon nitride (SiN), or other suitable materials.

Reference is made to FIGS. 15A, 15B, 15C, and 15D. A third etching back process is performed to partially remove the hard masks 200. That is, a top surface of the hard mask 200 is lower than a top surface of the gate spacer 170'. In some embodiments, the third etching back process may be suitable process, such as dry etching or wet etching.

Reference is made to FIGS. 16A, 16B, 16C, and 16D. A third interlayer dielectric 210 is formed over the substrate 100. The third interlayer dielectric 210 is formed on the hard masks 200, the second interlayer dielectric 180, and the metal gate stacks 190'. In some embodiments, the third interlayer dielectric 210 may include silicon oxide, oxynitride or other suitable materials. The third interlayer dielectric 210 includes a single layer or multiple layers. The third interlayer dielectric 210 can be formed by a suitable technique, such as CVD or ALD.

Reference is made to FIGS. 17A, 17B, 17C, and 17D. A patterned photoresist layer (PR) 220 is formed on the third interlayer dielectric 210 and over the substrate 100. In some embodiments, the PR layer 220 may include a carbon backbone polymer. The PR layer 220 may include other suitable materials such as a solvent and/or photo acid generators. For example, the PR layer 220 is a chemical amplified (CA) resist known in the art. In some embodiments, the PR layer 220 includes a photo-acid generator (PAG) distributed in the photoresist layer.

Reference is made to FIGS. 18A, 18B, 18C, and 18D. The third interlayer dielectric 210 (see FIGS. 17A to 17D) is patterned with the photoresist layer 220 to expose portions of the second interlayer dielectric 180. The patterned third interlayer dielectric 210 is labeled as 210' in later steps for description.

Reference is made to FIGS. 19A, 19B, 19C, and 19D. The PR layer 220 (see FIGS. 18A to 18D) is removed by suitable process, such as stripping or ashing. Then, the second interlayer dielectric 180 is patterned with the third interlayer dielectric 210' to form a plurality of recess 212 therein. In some embodiments, portions of the second interlayer dielectric 180 exposed from the third interlayer dielectric 210' are removed by, for example, etching process. Other portions of the second interlayer dielectric 180 covered by the third interlayer dielectric 210' are protected during the etching process. The patterned second interlayer dielectric 180 is labeled as 180' in later steps for description.

Figure 20B:
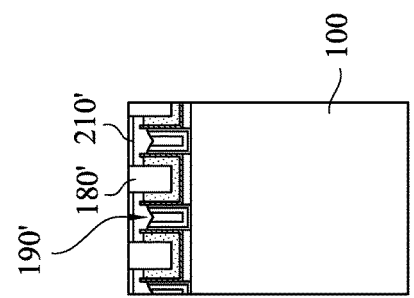
Figure 20D:
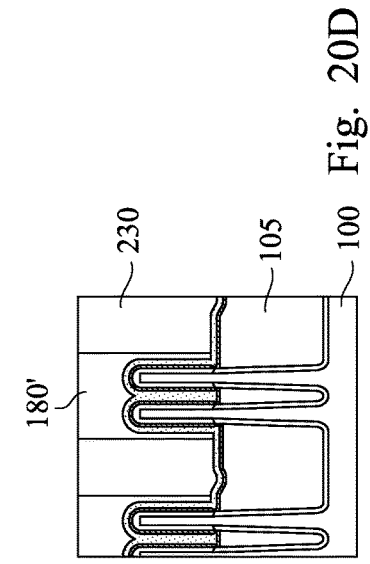
Figure 20A:
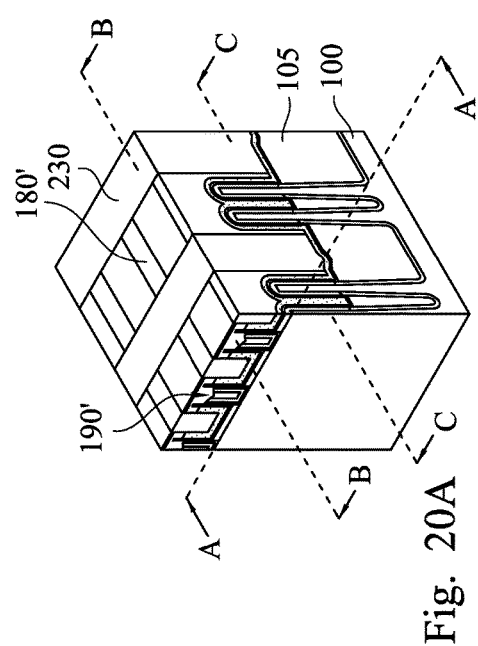
Figure 20C:
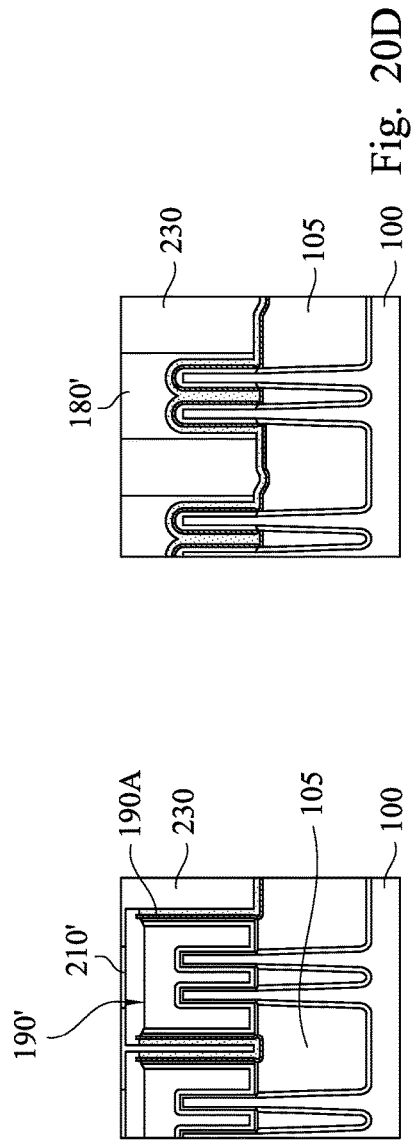
Figure 22B:
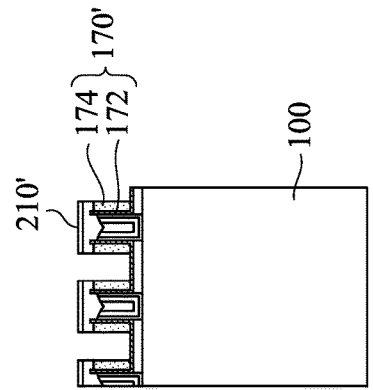
Figure 22A:
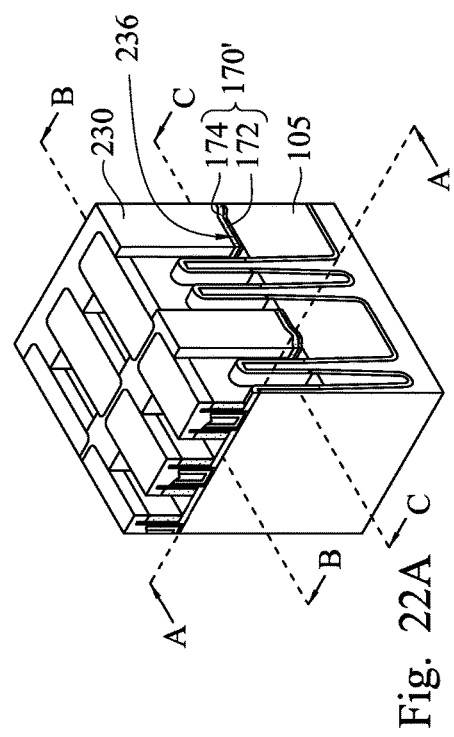
Figure 22D:
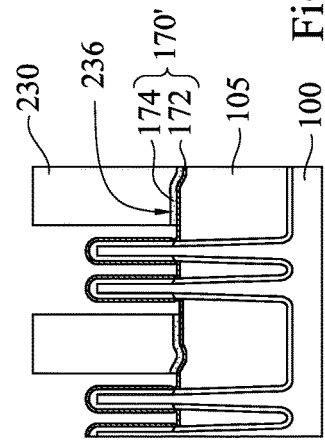
Figure 22C:
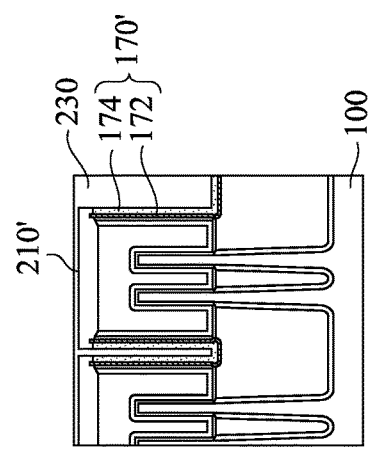

Reference is made to FIGS. 20A, 20B, 20C, and 20D. A fourth interlayer dielectric 230 is formed over the substrate 100 and in the recesses 212 (see FIGS. 19A and 19C). The fourth interlayer dielectric 230 is disposed on the isolation structures 105. In FIG. 20C, the fourth interlayer dielectric 230 is formed on end sides 190A of the metal gate stacks 190' and surround the metal gate stacks 190'. A CMP process is performed to the fourth interlayer dielectric 230 until the second interlayer dielectric 180' is exposed. The material of the fourth interlayer dielectric 230 and the third interlayer dielectric 210' may be the same in some embodiments, and may be different in some other embodiments. The fourth interlayer dielectric 230 may include silicon oxide, oxynitride or other suitable materials, and may include a single layer or multiple layers.

Reference is made to FIGS. 21A, 21B, 21C, and 21D. The second interlayer dielectric 180' is removed by suitable process, such as etching. After the second interlayer dielectric 180' is removed, portions of the gate spacers 170' covering the epitaxy structures 160 are exposed. In some embodiments, the materials of the second interlayer dielectric 180' and the gate spacers 170' are selected to provide etching selectivity, such that the gate spacers 170' may remain during the removal of the second interlayer dielectric 180'.

Reference is made to FIGS. 22A, 22B, 22C, and 22D. The second dielectric 174 of the exposed gate spacers 170' are removed by suitable process, such as etching. After the second dielectric 174 of the exposed gate spacers 170' are removed, the first dielectric 172 of the exposed gate spacers 170' are exposed, as shown if FIGS. 22A, 22B, and 22D. On the other hands, the second dielectric 174 of the gate spacers 170' covered by the third interlayer dielectric 210' and the fourth interlayer dielectric 230 remain during the etching process. In other words, the third interlayer dielectric 210' and the fourth interlayer dielectric 230 act as a hard mask and protect the second dielectric 174 underlying during the etching process.

Reference is made to FIGS. 23A, 23B, 23C, and 23D. The first dielectric 172 of the exposed gate spacers 170' are removed by suitable process, such as etching. After the first dielectric 172 of the exposed gate spacers 170' are removed, the epitaxy structures 160 are exposed, as shown if FIGS. 23A, 23B, and 23D. In other words, the first dielectric 172 and the second dielectric 174 of the gate spacers 170' on the top surface 160S of the epitaxy structures 160 are partially removed, such that the epitaxy structures 160 are exposed. On the other hands, the first dielectric 172 of the gate spacers 170' covered by the third interlayer dielectric 210' and the fourth interlayer dielectric 230 remain during the etching process. In other words, the third interlayer dielectric 210' and the fourth interlayer dielectric 230 act as a hard mask and protect the first dielectric 172 underlying during the etching process.

Figure 23B:
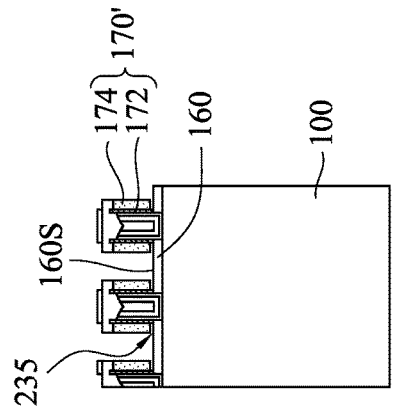

In FIG. 23B, in some embodiments, the first dielectric 172 are etched such that a plurality of recesses 235 are formed between the second dielectric 174 and the epitaxy structures 160. Moreover, the first dielectric 172 of the gate spacers 170' is in contact with the top surface 160S of the epitaxy structures 160. In some other embodiments, the first dielectric 172 and the second dielectric 174 (not shown) of the gate spacers 170' are in contact with the top surface 160S of the epitaxy structures 160.

Figure 23D:
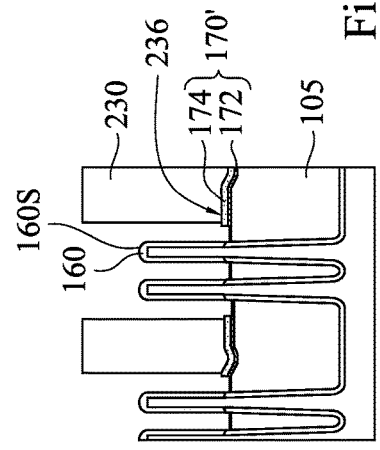
Figure 23A:
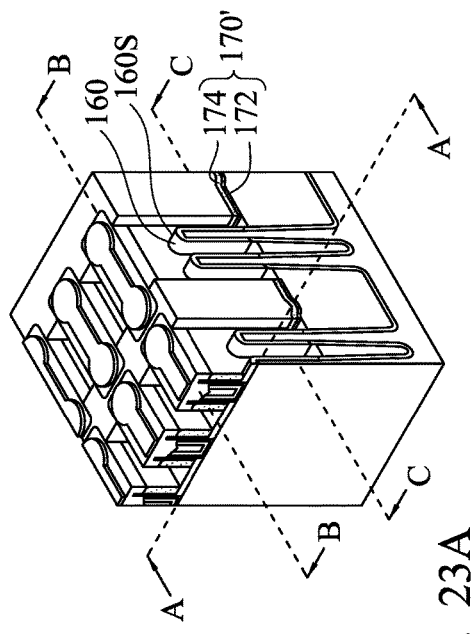
Figure 23C:
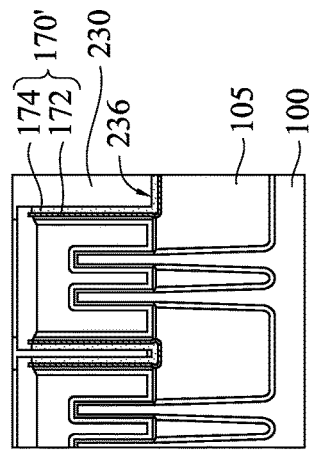
Figure 24B:
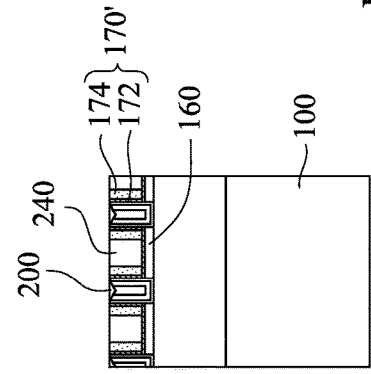
Figure 24D:
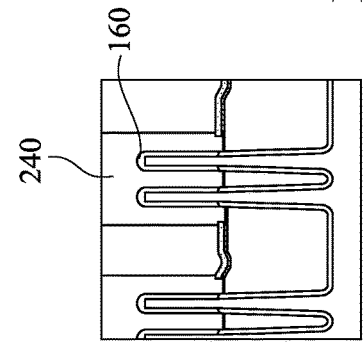
Figure 24A:
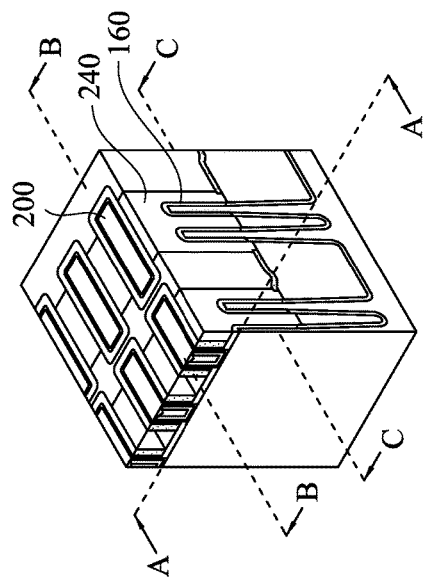
Figure 24C:
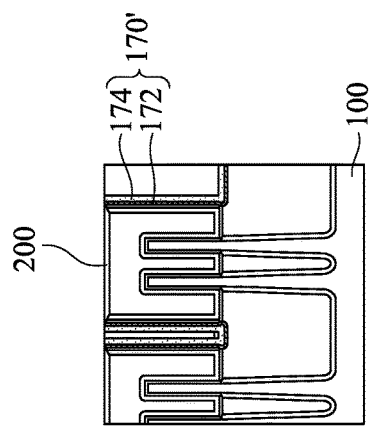

In FIG. 23D, portions of the gate spacers 170' are disposed between a space 236 between the fourth interlayer dielectric 230 and the isolation structures 105. In other words, the gate spacers 170' extend into the space 236 between the fourth interlayer dielectric 230 and the isolation structures 105.

Reference is made to FIGS. 24A, 24B, 24C, and 24D. A plurality of contacts 240 are formed on and in contact with the exposed epitaxy structures 160. In some embodiments, the contacts 240 are filled in the recesses 235 (as shown in FIG. 23B) and in contact with the second dielectric 174 of the gate spacers 170'. The contacts 240 may be formed by depositing a conductive material layer over the substrate 100 and following with a CMP process until the hard masks 200 are exposed. In some embodiments, the contacts 240 may include titanium (Ti), aluminum (Al), titanium nitride (TiN), tungsten (W), or other suitable materials.

According to the aforementioned embodiments, a dual dummy gate replacement is provided. A first dummy gate is replaced with a second dummy gate, in which the second dummy gate may include material different from silicon to prevent poly void and epitaxial residues formed on gate spacers. An epitaxy structure is formed before the gate spacers, such that the epitaxy structure has good quality, and the fin structures have less strain loss. With this configuration, the performance of the semiconductor device can be improved.

According to some embodiments, a method for manufacturing a semiconductor device includes forming a first dummy gate over a substrate; forming at least one epitaxy structure in contact with the first dummy gate; forming a spacer layer in contact with the first dummy gate and the epitaxy structure; and replacing the first dummy gate with a metal gate stack.

According to some embodiments, a method for manufacturing a semiconductor device includes forming a first dummy gate over a semiconductor fin of a substrate; forming a plurality of selective etching stop layers on opposite sidewalls of the first dummy gate; removing the first dummy gate to form an opening between the selective etching stop layers; forming a second dummy gate in the opening; removing the selective etching stop layers to expose at least a sidewall of the second dummy gate; and replacing the second dummy gate with a metal gate stack.

According to some embodiments, a semiconductor device includes a substrate comprising a semiconductor fin; an isolation structure disposed on the substrate and adjacent to the semiconductor fin; a gate stack disposed on the semiconductor fin; at least one epitaxy structure disposed on the semiconductor fin; an interlayer dielectric disposed on the isolation structure and surround the gate stack; and a gate spacer in contact with a sidewall of the gate stack and extending into a space between the interlayer dielectric and the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a first dummy gate over a substrate;
   forming at least one epitaxy structure in direct contact with the first dummy gate;
   forming a spacer layer in contact with the first dummy gate and the epitaxy structure; and
   replacing the first dummy gate with a metal gate stack.

2. The method of claim 1, further comprising forming a second dummy gate over the substrate, wherein the forming the first dummy gate comprises replacing the second dummy gate with the first dummy gate.

3. The method of claim 2, further comprising:
   forming a selectively etching stop layer over the substrate and the second dummy gate.

4. The method of claim 3, further comprising:
   forming a first interlayer dielectric over the selectively etching stop layer.

5. The method of claim 4, further comprising:
   removing the first interlayer dielectric and the selectively etching stop layer to expose at least one sidewall of the first dummy gate before the forming the epitaxy structure, and the epitaxy structure is in contact with the sidewall of the first dummy gate.

6. The method of claim 1, further comprising:
   forming a second interlayer dielectric between a plurality of spacers formed in the spacer layer, wherein the second interlayer dielectric is made from silicon.

7. The method of claim 1, further comprising:
   recessing the metal gate stack; and
   forming a hard mask on the recessed metal gate stack.

8. The method of claim 1, further comprising:
   partially removing the spacer layer to expose the epitaxy structure; and
   forming a contact on the exposed epitaxy structure.

9. A method for manufacturing a semiconductor device, comprising:
   forming a first dummy gate over a semiconductor fin of a substrate;
   forming a plurality of selective etching stop layers on opposite sidewalls of the first dummy gate;
   removing the first dummy gate to form an opening between the selective etching stop layers;
   forming a second dummy gate in the opening;
   removing the selective etching stop layers to expose at least a sidewall of the second dummy gate; and
   replacing the second dummy gate with a metal gate stack.

10. The method of claim 9, further comprising forming at least one epitaxy structure over the semiconductor fin and in contact with the sidewall of the second dummy gate.

11. The method of claim 10, further comprising:
    forming at least one gate spacer on the sidewall of the second dummy gate and a top surface of the epitaxy structure.

12. The method of claim 11, further comprising:
    removing a portion of the gate spacer on the top surface of the epitaxy structure; and
    forming a contact on the epitaxy structure.

13. The method of claim 11, further comprising forming a first interlayer dielectric on the gate spacer.

14. The method of claim 13, further comprising:
    patterning the first interlayer dielectric to form a recess therein; and
    forming a second interlayer structure in the recess and at one end side of the metal gate stack.

15. A semiconductor device, comprising:
    a substrate comprising a semiconductor fin;
    an isolation structure disposed on the substrate and adjacent to the semiconductor fin;
    a gate stack disposed on the semiconductor fin;
    at least one epitaxy structure disposed on the semiconductor fin;
    an interlayer dielectric disposed on the isolation structure and surround the gate stack; and
    a gate spacer in contact with a sidewall of the gate stack and extending into a space between the interlayer dielectric and the isolation structure.

16. The semiconductor device of claim 15, further comprising a contact disposed on the epitaxy structure, wherein the contact is in contact with the gate spacer.

17. The semiconductor device of claim 15, wherein the gate spacer is further in contact with a top surface of the epitaxy structure.

18. The semiconductor device of claim 15, wherein the gate spacer comprises a first dielectric and a second dielectric, wherein the second dielectric is in contact with the sidewall of the gate stack.

19. The semiconductor device of claim 15, wherein the epitaxy structure is in contact with the gate stack.

20. The semiconductor device of claim 19, further comprising a hard mask disposed on the gate stack.

* * * * *